United States Patent
Yamakita et al.

(10) Patent No.: US 6,411,138 B2
(45) Date of Patent: Jun. 25, 2002

(54) BUZZER DRIVE CIRCUIT

(75) Inventors: Shigeyuki Yamakita; Hirotsugu Matsuura; Manabu Matsuo, all of Kanagawa (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/779,311

(22) Filed: Feb. 8, 2001

(30) Foreign Application Priority Data

Feb. 9, 2000 (JP) .......................................... 2000-31807

(51) Int. Cl.[7] .............................................. H03K 17/687
(52) U.S. Cl. ........................ 327/109; 327/427; 327/434
(58) Field of Search .................................. 327/108, 109, 327/77, 427, 432, 434, 435, 478, 560–563

(56) References Cited

U.S. PATENT DOCUMENTS 4,491,744 A * 1/1985 Corey ........................ 327/109
5,514,989 A * 5/1996 Sato et al. ................... 327/109
5,798,662 A * 8/1998 Marosek et al. ............ 327/109

FOREIGN PATENT DOCUMENTS

GB    2 019 696    4/1979

* cited by examiner

*Primary Examiner*—Toan Tran
(74) *Attorney, Agent, or Firm*—Pearne & Gordon LLP

(57) ABSTRACT

A drain current of an FET (4) is controlled to control an output of a buzzer (11), and a gate voltage of the FET (4) is controlled by an operational amplifier (3) for changing a source output of the FET (4) into an inverted input. By such a negative feedback circuit structure, a path for controlling a buzzer output is set to be one system and stability of the buzzer output can be enhanced. A variable power supply (2) for changing an output in accordance with control data of a logic section (1) is set to be a non-inverted input of the operational amplifier (3). Consequently, it is possible to obtain a circuit structure which does not depend on the number of bits of the control data.

1 Claim, 2 Drawing Sheets

BUZZER DRIVE CIRCUIT

BACKGROUND OF THE INVENTION

The present invention relates to a buzzer drive circuit, and more particularly to a buzzer drive circuit implementing a reduction in a size of the circuit and stabilization of a buzzer output.

FIG. 2 shows a conventional buzzer drive circuit. The buzzer drive circuit comprises an IC section 13 including a logic section 14, AND gates 15 to 18, FETs 19 to 22 and terminals 23 to 28. The terminal 28 is used for controlling a buzzer output waveform. The terminal 24 is grounded. Resistors 29 to 32 for determining weighting of a current flowing in a path between the terminals 25 to 28 and the buzzer 12 are connected to the respective terminals. Each of the AND gates 15 to 18 calculates AND of an output of the logic section 14 and a control input sent from the terminal 23, and supplies the AND to gates of the FETs 19 to 22. Sources of the FETs 19 to 22 are connected to the terminal 24 in common. Drains of the FETs 19 to 22 are connected to the terminals 25 to 28.

In the buzzer drive circuit having such a structure, the FETs 19 to 22 are ON/OFF controlled according to control data transferred from the logic section 14 so that the output of the buzzer is controlled. Moreover, the buzzer output waveform is controlled in response to a signal sent to the terminal 23. More specifically, when the terminal 23 is set in an OFF state, the AND gates 15 to 18 are always set in an OFF state and the buzzer does not sound. When the terminal 23 is set in an ON state, the AND gates 15 to 18 are selected to be turned ON/OFF according to the control data. For this reason, the buzzer sounds in a cycle of the signal input to the terminal 23. These AND gates are connected to the terminals 25 to 28 through the FETs, respectively. Therefore, the FETs are ON/OFF controlled depending on the ON/OFF of the AND gates, thereby opening or closing the paths reaching the terminals 25 to 28. Furthermore, the resistors 29 to 32 for determining the weighting of the current flowing to the respective paths are connected to the terminals 25 to 28, and the buzzer output is controlled by opening or closing the paths reaching the same terminals.

In FIG. 2, the number of data bits for buzzer output control is four, and the parts provided in the IC section 13 include four AND gates and four FETs in the same manner as the control data bits. Thus, the total number of the parts is eight. Moreover, the number of the terminals is six, that is, the terminal 23 for the ON/OFF control of the buzzer section, the terminal 24, and the terminals 25 to 28 connected to the drains of the FETs 19 to 22 respectively. Furthermore, it is necessary to provide four parts outside the IC other than the buzzer, that is, the resistors 29 to 32 for determining the weighting of the current flowing to the respective paths are required for the terminals 25 to 28.

In the conventional circuit structure, however, a path including an AND gate and an FET is provided corresponding to the number of bits of the control data transferred from the logic section. For this reason, when the number of bits of the control data is increased to enhance precision in buzzer control, the number of paths reaching the buzzer and the numbers of parts and terminals in the IC section are increased. Furthermore, a resistor to be externally provided is required for each terminal so that the number of parts to be externally provided is also increased. Moreover, paths are provided from the logic section to the terminals 25 to 28 in the IC section. Therefore, the buzzer output is influenced by the paths due to a variation in a value of the resistor connected to each terminal. Furthermore, the buzzer output is controlled under the control of an operation for opening/closing the paths to the terminals 25 to 28. Therefore, the output is affected by a change in an operating environment such as a temperature or a noise.

SUMMARY OF THE INVENTION

The invention has been made to solve the conventional problems and has an object to provide a buzzer drive circuit which can reduce a size of the circuit, can relieve the influence of a path on a buzzer output and can enhance stability of the buzzer output, and does not depend on the number of bits of control data.

A buzzer drive circuit according to the invention comprises: a buzzer output control voltage generator which generates a voltage corresponding to buzzer output control data; a transistor for buzzer output waveform control, in which a control signal of a buzzer output waveform is applied to a gate; and a transistor for buzzer output control in which an output of the buzzer output control voltage generator and an output of the transistor for buzzer output waveform control are applied to a gate. By such a structure, the voltage corresponding to the buzzer output control data which is generated by the buzzer output control voltage generator can be applied to the gate of the transistor for buzzer output control to control the buzzer output, and the output of the transistor for buzzer output waveform control can be applied to the gate of the transistor for buzzer output control, thereby controlling the buzzer output waveform. Therefore, it is possible to implement a circuit structure which can reduce the size of the buzzer drive circuit, can relieve the influence of the path on the buzzer output and does not depend on the number of bits of the control data.

Moreover, the buzzer output control voltage generator includes: a variable power supply for changing an output voltage in accordance with buzzer output control data transferred from a logic section; and an operational amplifier in which an output of the variable power supply is applied to a non-inverted input terminal and a negative feedback output of the transistor for buzzer output control is applied to an inverted input terminal. By such a structure, the stability of the buzzer output can be enhanced.

DETAILED DESCRIPTION OF THE PREFERRED EMBODIMENT

Figure 1:
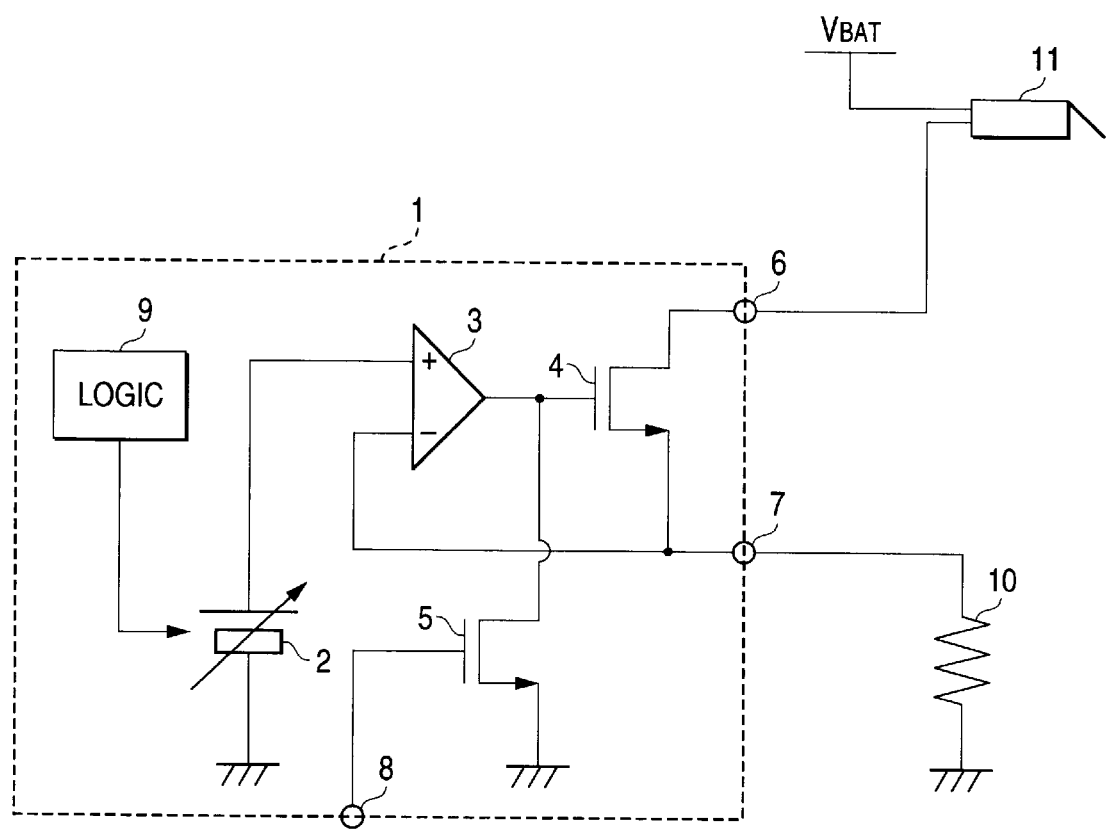
FIG. 1 is a diagram showing a buzzer drive circuit according to an embodiment of the invention.
Figure 2:
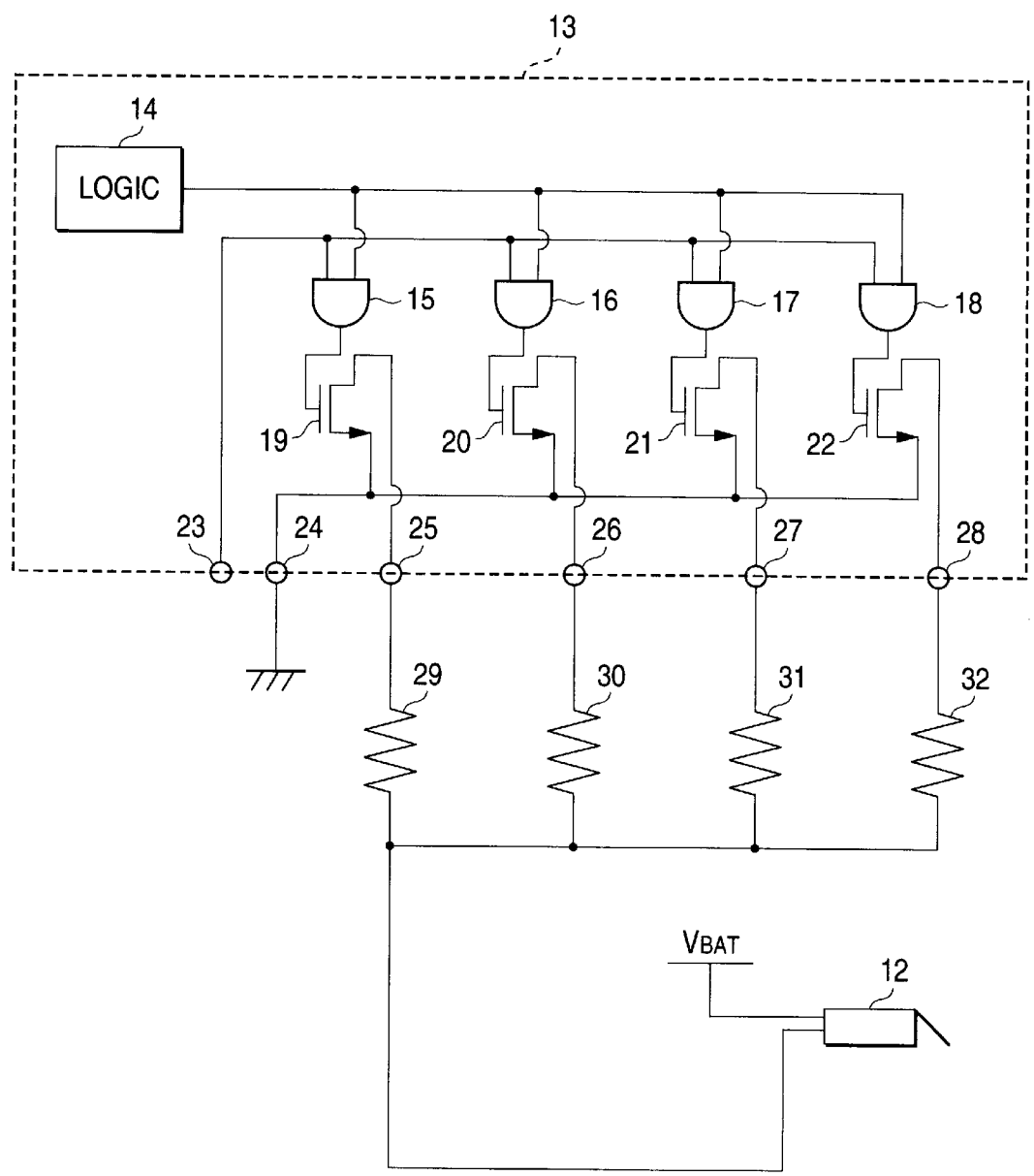
FIG. 2 is a diagram showing a conventional buzzer drive circuit.

An embodiment of the invention will be described below with reference to the drawings. FIG. 1 is a diagram showing a buzzer drive circuit according to the embodiment of the invention.

The buzzer drive circuit comprises an IC section 1 including a variable power supply 2, an operational amplifier 3, an FET 4 for buzzer output control, an FET 5 for buzzer output waveform control, terminals 6 to 8, and a logic section 9. A buzzer 11 is connected to the terminal 6. A resistor 10 for determining a maximum current of the buzzer 11 is connected to the terminal 7. A buzzer output waveform control signal is input to the terminal 8.

The variable power supply 2 changes an output voltage in accordance with buzzer output control data transferred from the logic section. An output of the variable power supply 2 is input to a non-inverted input terminal of the operational amplifier 3. An output of the operational amplifier 3 is input to a gate of the FET 4. A source of the FET 4 forms a negative feedback circuit fed back to an inverted input terminal of the operational amplifier 3, thereby constituting a constant current circuit. The FET 4 has a drain connected to the terminal 6 and the source connected to the terminal 7. Accordingly, a level of a current flowing in order of a power battery $V_{BAT}$, the buzzer 11, the FET 4, the resistor 10 and a ground can be variably controlled depending on a change in a voltage applied to the gate of the FET 4.

Moreover, a signal for buzzer output waveform control input from the terminal 8 is applied to a gate of the FET 5, and the FET 5 has a drain connected to the gate of the FET 4 and a source grounded. Accordingly, a gate voltage of the FET 4 is changed according to a level of the signal for buzzer output waveform control input to the gate of the FET 5. In other words, a buzzer output waveform can be changed in response to the signal for buzzer output waveform control input from the terminal 8.

Next, an operation according to the embodiment will be described. The output voltage of the variable power supply 2 is controlled by control data transferred from the logic section 9 and an output of the operational amplifier 3 is controlled in response to the output of the power supply 2. Furthermore, a drain current of the FET 4 is controlled in response to the output of the operational amplifier 3 so that a buzzer output is controlled. In other words, the buzzer output can be controlled under the control of the drain current of the FET 4 based on the control data transferred from the logic section 9. At this time, the maximum current of the buzzer is determined by the resistor 10. Because of a constant current circuit structure in which the source of the FET 4 is fed back to the inverted input terminal of the operational amplifier 3, moreover, a stable buzzer output can be obtained. Furthermore, the output of the FET 5 is changed in a cycle of the signal input to the terminal 8. The drain of the FET 5 is connected to the gate of the FET 4. Therefore, the buzzer 11 sounds in response to the output of the FET 5.

The FET 4 for controlling a buzzer output and the FET 5 for controlling a buzzer output waveform may be bipolar transistors, respectively.

In the buzzer drive circuit according to the embodiment, thus, the output of the buzzer 11 is controlled by the drain current of the FET 4. Consequently, the IC section 1 has only three terminals, that is, the drain terminal 6 of the FET 4, the source terminal 7 and the terminal 8 for buzzer output waveform control. Thus, the number of the terminals can be decreased.

Moreover, only the resistor 10 is provided on the outside of the IC section 1 in addition to the buzzer with a decrease in the number of the terminals. Consequently, the number of the parts to be provided externally can be decreased.

Furthermore, it is preferable that the inside of the IC section 1 should have a circuit structure for controlling the FET 4. Therefore, the number of parts can be reduced. As a result, the sizes of the inside of the IC section 1 and the whole buzzer drive circuit can be reduced.

In the conventional buzzer drive circuit, moreover, the terminal 23 for buzzer output waveform control has been connected to the input terminals of the AND gates 15 to 18. The outputs of the AND gates 15 to 18 are binary outputs constituted by only H (High)/L (Low). Therefore, only ON/OFF control of the FETs 19 to 22 is carried out so that the buzzer output waveform is changed into a digital waveform. On the other hand, in the buzzer drive circuit according to the embodiment, the gate of the FET 4 is connected to the drain of the FET 5. Consequently, the buzzer output waveform can be changed into an optional analog waveform such as a sine wave as well as the digital waveform in response to the input signal sent from the terminal 8.

The path for controlling the buzzer output is one system of a path for controlling the FET 4. Therefore, the influence of the path on the buzzer output can be relieved. The FET 4 is controlled by the output of the operational amplifier 3. However, the source of the FET 4 is the inverted input of the operational amplifier 3. Therefore, such a negative feedback circuit structure can enhance the stability of the buzzer output.

Furthermore, the drain current of the FET 4 can be controlled in accordance with the control data transferred from the logic section 9 so that the buzzer output is controlled. Consequently, it is possible to obtain the same circuit structure irrespective of the number of bits of the control data.

As described above, in the buzzer drive circuit according to the invention, the voltage corresponding to the buzzer output control data which is generated by the buzzer output control voltage generator can be applied to the gate of the transistor for buzzer output control, thereby controlling the buzzer output, and the output of the transistor for buzzer output waveform control can be applied to the gate of the transistor for buzzer output control, thereby controlling the buzzer output waveform. Therefore, it is possible to implement a circuit structure which can reduce the size of the buzzer drive circuit, can relieve the influence of the path on the buzzer output and does not depend on the number of bits of the control data.

Moreover, the buzzer output control voltage generator includes a variable power supply for changing an output voltage in accordance with buzzer output control data transferred from a logic section and an operational amplifier in which an output of the variable power supply is applied to a non-inverted input terminal and a negative feedback output of the transistor for buzzer output control is applied to an inverted input terminal. By such a structure, the stability of the buzzer output can be enhanced.

What is claimed is:

1. A buzzer drive circuit comprising:

a buzzer output control voltage generator which generates a voltage corresponding to buzzer output control data;

a transistor for buzzer output waveform control in which a control signal of a buzzer output waveform is applied to a gate; and a transistor for buzzer output control in which an output of the buzzer output control voltage generator and an output of the transistor for buzzer output waveform control are applied to a gate;

wherein the buzzer output control voltage generator includes:

a variable power supply which changes an output voltage in accordance with buzzer output control data transferred from a logic section; and an operational amplifier in which an output of the variable power supply is applied to a non-inverted input terminal and a negative feedback output of the transistor for buzzer output control is applied to an inverted input terminal.

* * * * *